(12) United States Patent
Haldorsen et al.

(10) Patent No.: US 9,791,051 B2
(45) Date of Patent: Oct. 17, 2017

(54) DLC-COATED GATE VALVE IN PETROLEUM PRODUCTION OR WATER INJECTION

(71) Applicant: Aker Subsea AS, Lysaker (NO)

(72) Inventors: Henrik Dishington Haldorsen, Oslo (NO); Dag Twist, Drammen (NO)

(73) Assignee: Aker Subsea AS, Lysaker (NO)

( * ) Notice: Subject to any disclaimer, the term of this patent is extended or adjusted under 35 U.S.C. 154(b) by 0 days.

(21) Appl. No.: 14/380,481

(22) PCT Filed: Feb. 28, 2013

(86) PCT No.: PCT/NO2013/050041
§ 371 (c)(1),
(2) Date: Aug. 22, 2014

(87) PCT Pub. No.: WO2013/129939
PCT Pub. Date: Sep. 6, 2013

(65) Prior Publication Data
US 2015/0053281 A1    Feb. 26, 2015

(30) Foreign Application Priority Data
Feb. 28, 2012 (NO) .................................. 20120218

(51) Int. Cl.
*F16K 3/02* (2006.01)
*C23C 16/26* (2006.01)
(Continued)

(52) U.S. Cl.
CPC ........ *F16K 3/0263* (2013.01); *C23C 14/0605* (2013.01); *C23C 16/26* (2013.01);
(Continued)

(58) Field of Classification Search
CPC ........ F16K 27/041; F16K 3/24; F16K 25/005; C23C 14/0605; C23C 28/313;
(Continued)

(56) References Cited

U.S. PATENT DOCUMENTS 4,440,381 A * 4/1984 Tipton, Jr. ............ F16K 3/0227
251/214
4,471,943 A * 9/1984 Nelson ...................... F16K 3/02
251/327

(Continued)

FOREIGN PATENT DOCUMENTS

| CN | 1729368 A | 2/2006 |
| CN | 101629497 A | 1/2010 |

(Continued)

OTHER PUBLICATIONS

Grundfelt, Ingrid, "International Search Report," prepared for PCT/NO2013/050041, as mailed Jun. 3, 2013, six pages.

(Continued)

*Primary Examiner* — Marina Tietjen
(74) *Attorney, Agent, or Firm* — Winstead PC

(57) ABSTRACT

The invention provides a gate valve (1) for control of petroleum production or water injection, distinctive in that at least one surface subject to sliding in operation of the valve comprises a top layer coating of diamond like carbon (DLC). The DLC contains hydrogen, preferably more than 16 atom-% and more preferred more than 17 atom-%. It is further directed to a method of commissioning or operating a gate valve according to the invention, and use of a diamond like carbon (DLC) top layer coating on at least one surface subject to sliding in operation of the gate valve. Valve parts have a tendency of sticking, adhering or cold welding together, which result in high friction. The aim of the invention is to reduce or eliminate friction problems occur- (Continued)

ring with time or operation cycles, when using a full scale gate valve.

9 Claims, 4 Drawing Sheets

(51) Int. Cl.
  *E21B 34/04* (2006.01)
  *C23C 14/06* (2006.01)
  *C23C 28/04* (2006.01)

(52) U.S. Cl.
  CPC .......... *C23C 28/042* (2013.01); *C23C 28/046* (2013.01); *E21B 34/04* (2013.01); *F16K 3/0236* (2013.01); *Y10T 137/7036* (2015.04)

(58) Field of Classification Search
  CPC . C23C 14/028; C23C 14/0611; C23C 14/024; C23C 28/046; C23C 4/02; F02C 7/232; F01L 3/04; F05D 2300/224; F05D 2230/90
  USPC ........................................................ 251/368
  See application file for complete search history.

(56) References Cited

U.S. PATENT DOCUMENTS

| | | | | |
|---|---|---|---|---|
| 4,568,062 | A * | 2/1986 | Regitz | F16K 3/0236 137/72 |
| 4,625,942 | A * | 12/1986 | Nelson | F16K 3/0227 251/172 |
| 4,911,410 | A * | 3/1990 | Baker | E21B 29/04 251/1.3 |
| 5,803,431 | A * | 9/1998 | Hoang | E21B 29/04 251/326 |
| 1,004,206 | A1 | 2/2011 | Bailey et al. | |
| 2004/0118455 | A1 | 6/2004 | Welty et al. | |
| 2006/0105172 | A1* | 5/2006 | Yamamoto | C23C 14/025 428/408 |
| 2007/0163655 | A1 | 7/2007 | Hunter | |
| 2008/0251798 | A1* | 10/2008 | Ogihara | H01L 33/641 257/88 |
| 2011/0192521 | A1 | 8/2011 | Ducros et al. | |
| 2011/0293855 | A1* | 12/2011 | Suzuki | C23C 16/26 427/577 |
| 2012/0132842 | A1* | 5/2012 | Phillips | F16K 3/0227 251/359 |
| 2014/0001390 | A1* | 1/2014 | Alexander | F16K 3/0263 251/328 |

FOREIGN PATENT DOCUMENTS

| | | |
|---|---|---|
| EP | 1657323 A1 | 5/2006 |
| GB | 2286349 A | 8/1995 |
| WO | WO-2012156256 A1 | 11/2012 |

OTHER PUBLICATIONS

Hauert, R., et al., "An Overview on Tailored Tribological and Biological Behavior of Diamond-Like Carbon," Diamond and Related Materials, Feb. 2003, vol. 12, nr. 2, pp. 171-177.

Luoa, S.Y., et al., "A Study of the Wear Behavior of Diamond-Like Carbon Films Under the Dry Reciprocating Sliding Contact," Wear, 2001, vol. 249, pp. 800-807.

* cited by examiner

DLC-COATED GATE VALVE IN PETROLEUM PRODUCTION OR WATER INJECTION

FIELD OF THE INVENTION

The present invention relates to gate valves. More specifically, the invention relates to gate valves used in petroleum production systems such as Xmas trees connected to petroleum production wells and water injection wells.

BACKGROUND OF THE INVENTION AND PRIOR ART

Gate valves used for control of petroleum production are operated at high pressure and temperature. The well shut in pressure can be above 103,5 MPa, the contact pressure between valve parts is even higher, whilst the temperature can be above 177° C. In operation the valve can be in one position for long periods of time, such as in position open for petroleum production. According to standards, such as Norsok, the function of the valve is to be tested periodically, such as every third month.

Unfortunately the valves have an inherent friction problem. More specifically, the valve parts have a tendency of sticking, adhering or cold welding to each other, resulting in high friction. This is also termed stick slipping and galling. In order to overcome the friction problem, the actuators, umbilicals and other associated equipment must be dimensioned in order to operate the valve in a state of enhanced friction. Accordingly, actuators, umbilicals and other associated equipment, in addition to the valve itself or parts thereof, must be up to several times larger, stronger or expensive than required compared to the friction level at its lowest.

An approach that has been used for some time in order to overcome the problems is to apply coating on sealing faces of the valve. More specifically, coating of tungsten carbide is used. Currently, coating of tungsten carbide on surfaces subject to sliding is an industry standard for gate valves for control of petroleum production, particularly subsea petroleum production control valves. Despite the tungsten carbide coating, the sticking together of valve parts is still a severe problem. The effect of the sticking or friction problem is not only enhanced friction but also stick slipping or uneven movement of the valve gate during operation as compared to a smooth, even, continuous movement.

Friction tests reveal that the friction problem should have been solved by the coatings according to the industry standard. However, practical experience reveal that the friction sometimes increases to an enhanced level over time, from a lower start up level of friction, which is very surprising in view of the friction test results. Even though the friction problem has been encountered for many years, it has not yet been possible to mitigate.

US 20070163655 A1 describes a gate valve for use with well fluids, where the surfaces meant to slide against each other are coated with a hard carbide surface and a top layer of diamond like carbon (DLC). This document does not describe embodiments where the valve is used on subsea production equipment. Neither does the document mention the importance of hydrogen in the DLC.

US 2004118455 A1 also describes a valve where carbide and DLC are used on the sliding surfaces.

Luoa, S. Y. et al.: "A study of the water behavior of diamond like carbon films under the dry reciprocating sliding contact", Wear, 2001, vol. 249, pp. 800-807, describes that the coefficient of friction between surfaces treated with DLC and other surfaces, are reduced when the surfaces has passed through a certain number of sliding cycles.

The inventors have investigated the problem in depth in order to find further details on the problem, including when the problem occur and finding a solution to overcome the problem if possible. More specifically, the investigations revealed that larger surfaces appear sometimes to behave very different with respect to friction than smaller samples typically used for testing, even though the surfaces and coatings are identical, a large scale problem sometimes occur. More specifically, the investigations revealed that a severe friction problem can occur in a full scale real gate valve even though testing on smaller samples do not indicate any problem. This is surprising since the test procedures have been determined by experts in the field. Furthermore, valve fluid without oil contents, such as dry gas or water without oil, are found to enhance the problem in general, resulting in increased friction over time. Eventually, highly polished surfaces seem to increase the problem with respect to the unexpected size effect and the unexpected fluid type effect.

When the friction problem occurs, it will in general increase with time or operation cycles in a real full scale gate valve. The problem is still not quantified in great detail and the mechanisms resulting in the problems are not yet understood in great detail. But in addition to what is mentioned above the problems have been found to in general increase with increasing level of friction, increasing sliding distance, increasing contact pressure, increasing temperature, and particularly, the problems increase with time or operation cycles. The prevailing mode of friction is probably a dry or mixed type of friction. The problem is found to be very relevant for gate valves, particularly subsea gate valves, presumably due to large sealing surfaces, high pressures and long sliding distance.

The objective of the present invention is to reduce or eliminate the friction problem discussed above.

These objectives are obtained by a gate valve according to claim 1, a method of commissioning or operating a gate valve according to claim 5, and use of a diamond like carbon (DLC) top layer according to claim 8. Additional preferred embodiments are claimed in the dependent claims.

SUMMARY OF THE INVENTION

To this end, the invention provides a gate valve for control of petroleum production or water injection, distinctive in that at least one surface subject to sliding in operation of the valve comprises a top layer coating of diamond like carbon (DLC).

The solution of the invention solves or mitigates the above mentioned problems. This is very surprising since persons of ordinary skill in the art would have no particular guidance as to when the problems occur or how to solve them, since test procedures using smaller samples do not reveal the problem or give indications to a solution.

The valve can comprise several surfaces with top layer coating of DLC, such as the surfaces of a valve seat ring on either side of a gate member for sliding operation, as well as the gate. The valve may comprise other coatings, at other locations or as sub-layers of coating below a DLC coating top layer. The valve may comprise a DLC top layer coating on one or both facing surfaces subject to sliding, preferably one surface as this provides sufficient technical effect of the coating as revealed by full scale testing. Preferably at least one of the following surfaces subject to sliding is coated: the seat surfaces facing the gate and the gate surfaces facing the seat. However, any additional metal object surfaces subject to movement, as well as static surfaces, can be coated with a DLC top layer coating. Most preferably, at least one of all interfacing metal object sealing surfaces comprises a DLC top layer coating.

DLC coatings consist of a mix of sp3 and sp2 bonds, and it can also contain other elements as metal or hydrogen. DLC coatings with most sp3 bindings, typical 75% sp3 and above is called tetrahedral amorphous carbon (ta-C).

DLC coatings with a mix of sp3 and sp2 bindings are called amorphous carbon (a-C). If hydrogen is mixed into this coating, called hydrogenated amorphous carbon (a-C: H). If hydrogen is mixed into a ta-C it is called hydrogenated tetrahedral amorphous carbon (ta-C:H).

Full scale testing has revealed that the type of DLC coating is critical. The valve is tested to simulate real life conditions. This includes operation of the valve at both elevated temperatures and with both gas and fluid as pressure medium in the valve. Typical differential pressure in the valve during operating is 69 MPa, but could be as high as 138 MPa. A typical gas used for testing is nitrogen.

In nitrogen or other dry inert gasses the inventors found out that DLC containing hydrogen has a clear benefit over DLC coatings without any hydrogen, especially a-C:H DLC with a hydrogen content of 17 atom-% or more.

In a preferred embodiment the DLC-coating is applied on top of a carbide-coating or a chrome nitride coating. Preferably the DLC-coating has been applied by PVD (physical vapour deposition), PACVD (plasma assisted chemical vapour deposition) or CVD (chemical vapour deposition); alternatively other application methods known in the art for DLC coating application, directly on metal objects or on sub coatings, can be used. There are several suppliers that can apply DLC coating, such as Oerlikon Balzer of Lichtenstein and DIARC of Finland.

The invention provides use of a diamond like carbon (DLC) top layer coating on at least one surface subject to sliding in operation of a gate valve for control of petroleum production or water injection. Preferably, the use is for a subsea petroleum production or water injection Xmas tree gate valve, for coating at least one of all interfacing sliding and sealing surfaces.

FIGURES

The invention will be further explained in the following detailed description with reference to the drawings, of which:

DETAILED DESCRIPTION

Figure 1:
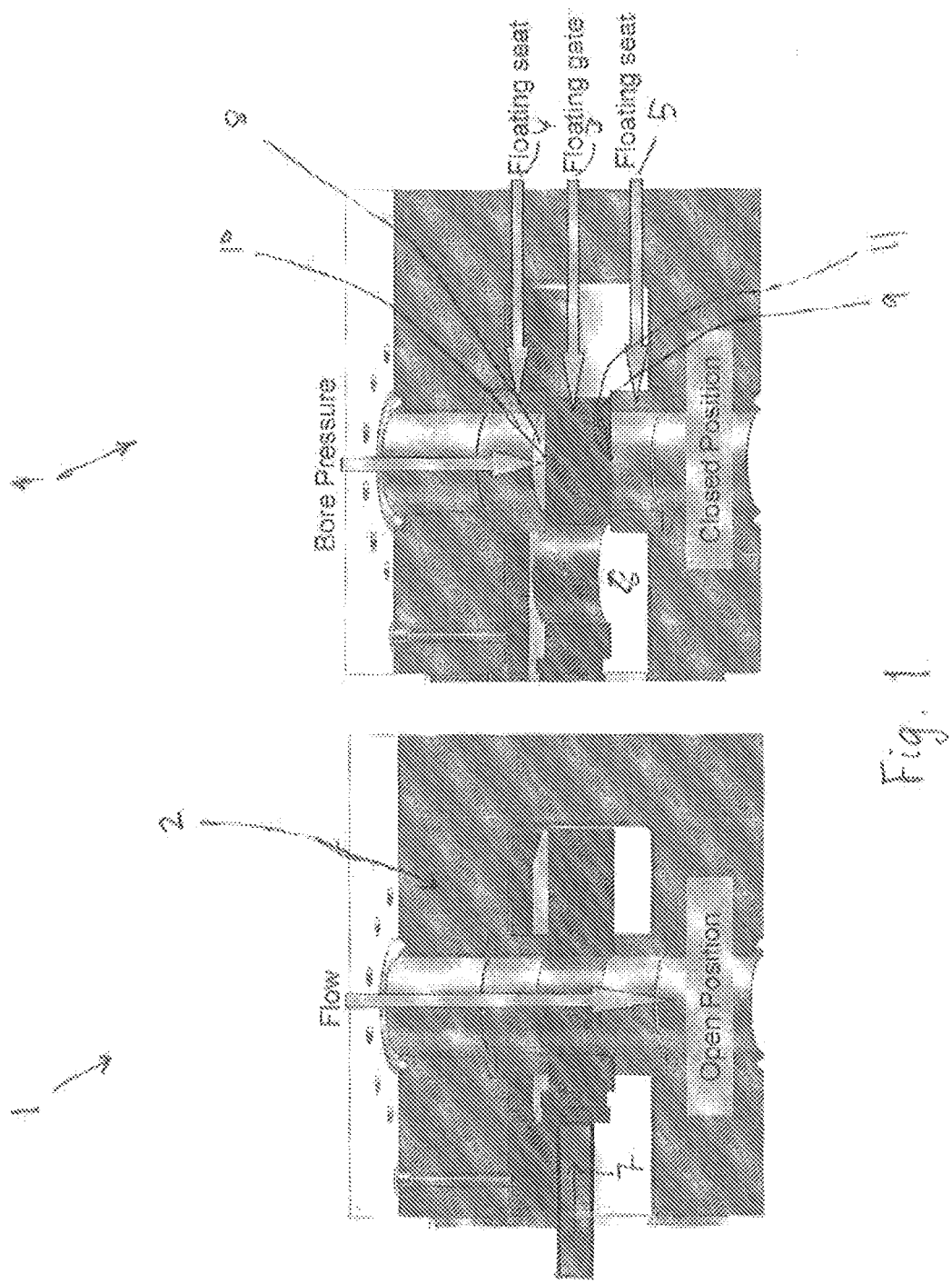
FIG. 1 illustrates an embodiment of a gate valve according to the invention, with surfaces coated by DLC.

Reference is made to FIG. 1, illustrating a gate valve 1 of the invention in open and closed position, respectively. The valve comprises a valve body 2, a gate 3 and two valve seats 4 and 5 respectively, the valve seats are arranged on either side of the gate 3 inside the valve body. The valve body, seats and gate includes a flow bore 6, the gate is connected to an actuator 7, the actuator can slide the gate so that the flow bore is open or closed. As the person skilled in the art easily will recognize, a typical gate valve is illustrated. For clarity, only one of the identical reference numerals for valve parts have been included for open and closed position illustrations. Preferably at least one of the following surfaces subject to sliding is coated: the seat surfaces 8 and 9 facing the gate and the gate surfaces 10 and 11 facing the seat. However, any additional metal object surfaces subject to movement, as well as static surfaces, can be coated with a DLC top layer coating. Most preferably, at least one of all interfacing metal object sealing surfaces comprises a DLC top layer coating. In a preferable embodiment, the seats comprise a DLC top layer coating both on the surfaces facing the gate and the opposite surfaces away from the gate.

Figure 2:
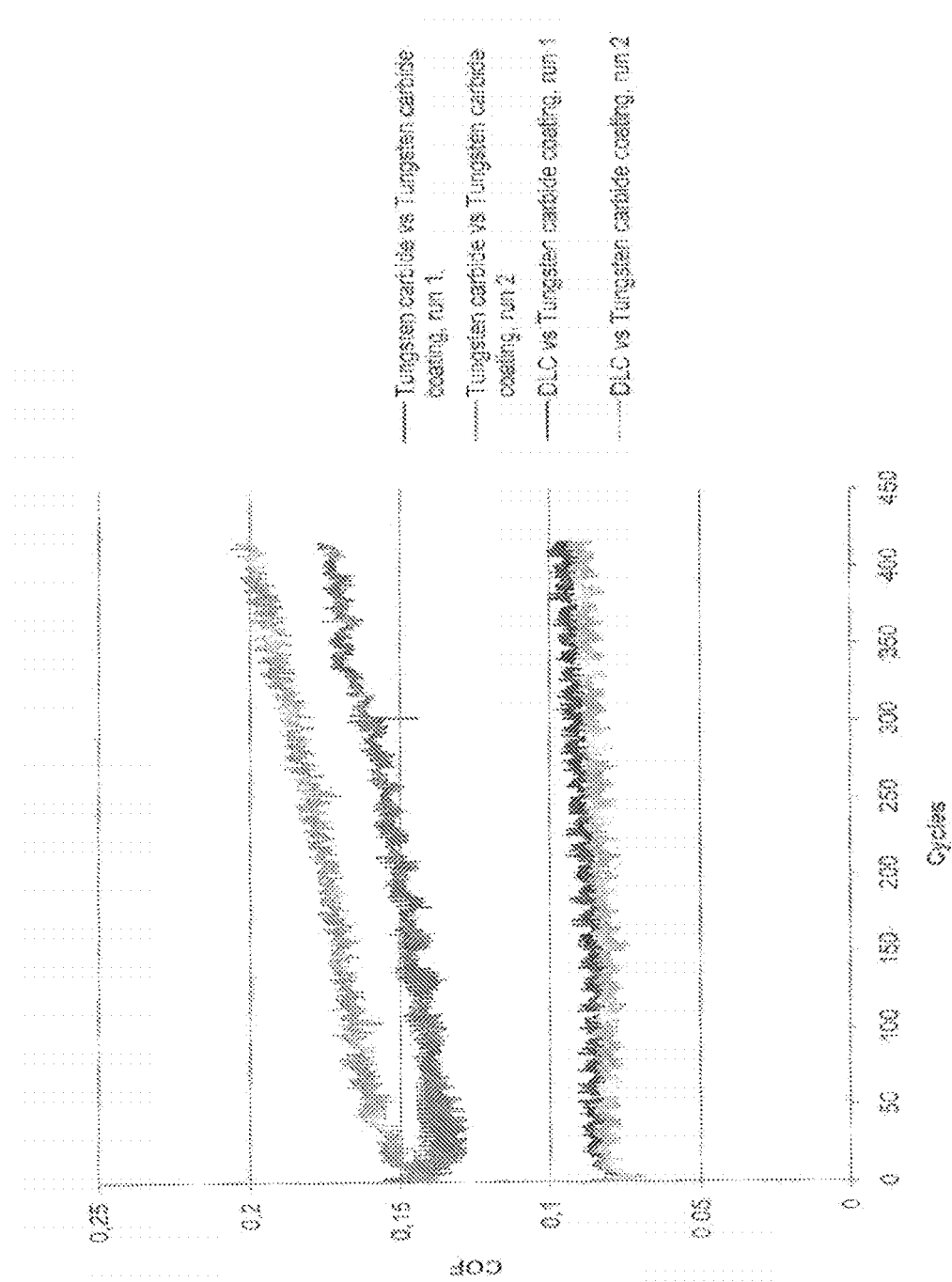
FIG. 2 illustrates the underlying problem of the invention.

Reference is made to FIG. 2, illustrating the coefficient of friction COF versus linear sliding distance test cycles at a contact pressure of 210 MPa at ambient test room temperature and no lubrication. The test is a small scale laboratory test. The data are for samples having tungsten carbide coating versus tungsten carbide coating as well as DLC top layer coating versus tungsten carbide coating. The tungsten carbide coatings were identical and according to industry standard for production tree or water injection tree gate valves. The curves reveal that the sample data are similar but the samples including one test object with a DLC top layer coating had a lower friction, at about 50% compared to tungsten carbide versus tungsten carbide. The curves increase slightly and at a similar or approximately identical relative rate. The data gives no indication to the person of ordinary skill in the art that a DLC top layer coating for a full scale real gate valve would give a dramatically different result.

Figure 3:
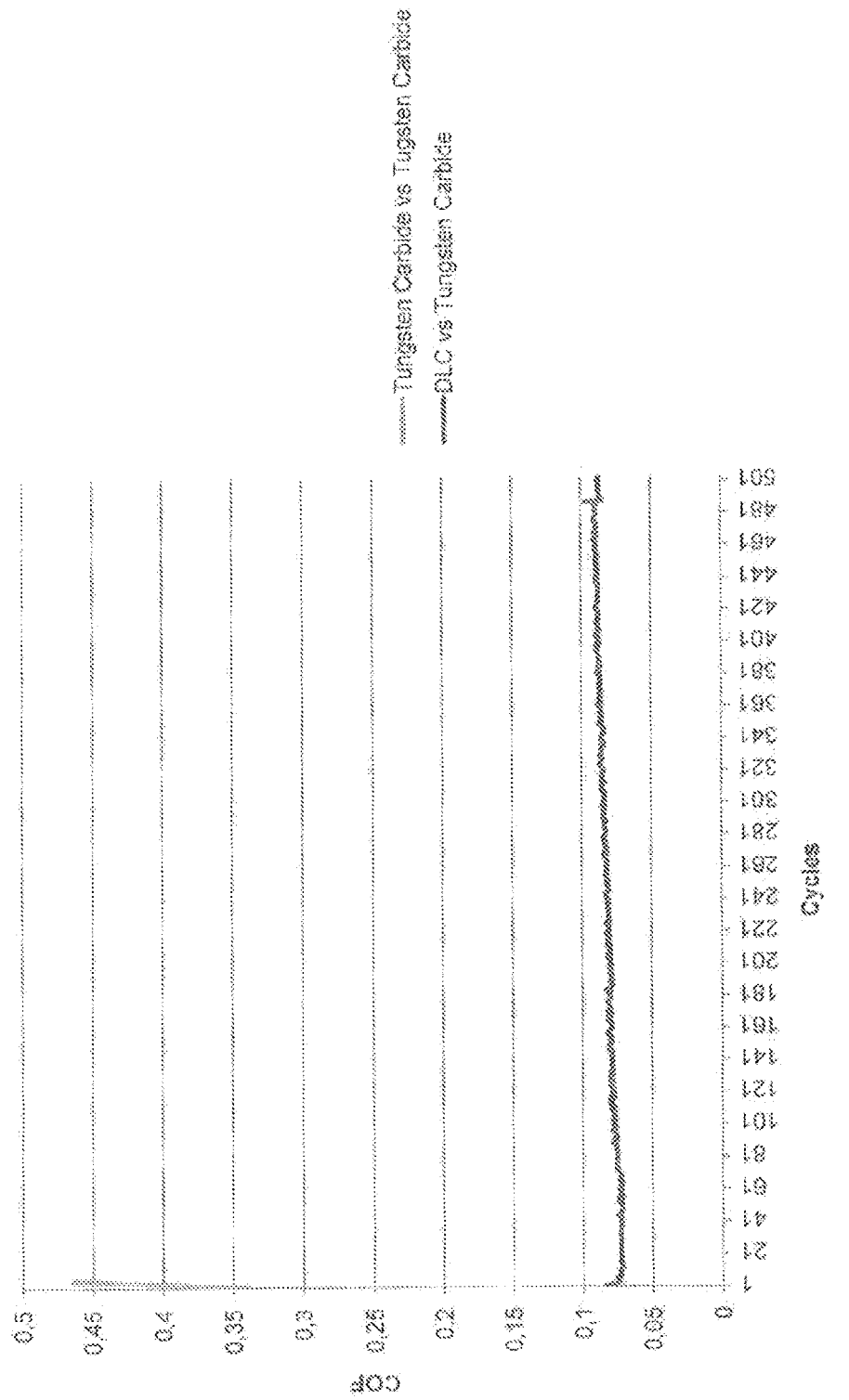
FIG. 3 illustrates the underlying problem and the technical effect of the invention.

Reference is made to FIG. 3, illustrating the results of a full scale gate valve test with no lubrication and water at 69 MPa as the valve pressure medium resulting in a contact pressure between the sliding surfaces of 210 MPa. Tungsten carbide versus tungsten carbide coating resulted in a start friction about three times higher than having a top layer coating according to the invention, which is surprising from the smaller difference in friction from the friction sample tests. However, the huge difference is that the valve with DLC top coating has a coefficient of friction COF below 0,1 after more than 500 open close cycles whilst the industry standard gate valve with tungsten carbide versus tungsten carbide coating was stopped after only 7 open close cycles due to rapidly increasing COF, as apparent from the curves. The invention provides a gate valve with a permanent very low friction level compared to industry standard valves, also after some time in service, without severe problems with pure water or dry gas service.

Figure 4:
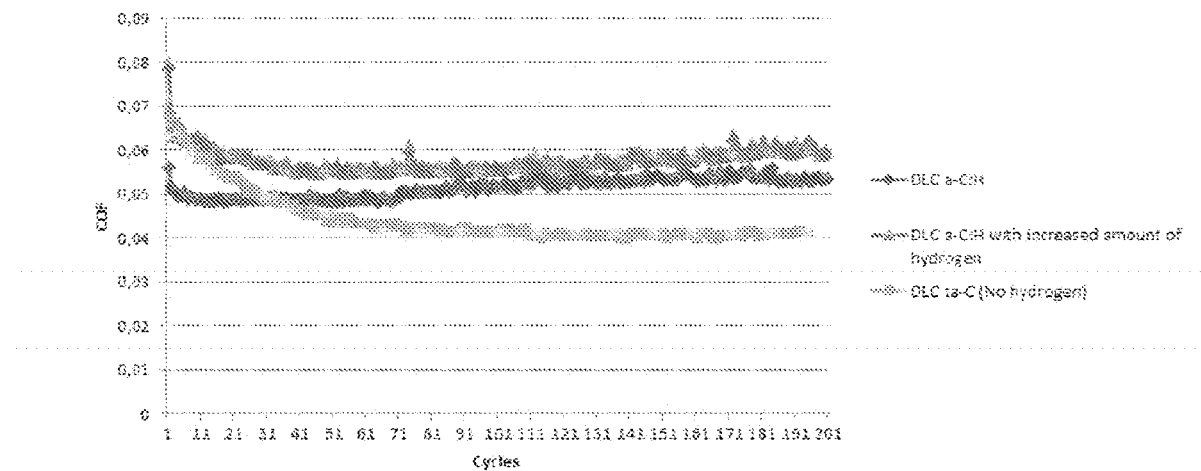
FIG. 4 illustrates the coefficient of friction (COF) as a function of the number of cycles for different DLC-coatings, at room temperature and water as pressure medium.

Reference is made to FIG. 4, illustrating the results of three full scale gate valve tests with no lubrication and water at 69 MPa as the valve pressure medium resulting in a contact pressure between the sliding surfaces of 210 MPa. The figure show the results from one coating without hydrogen and two coatings with hydrogen according to the invention sliding against a tungsten carbide gate. All of these coatings have a low stable friction compared to the tungsten carbide vs tungsten carbide solution in FIG. 3.

Figure 5:
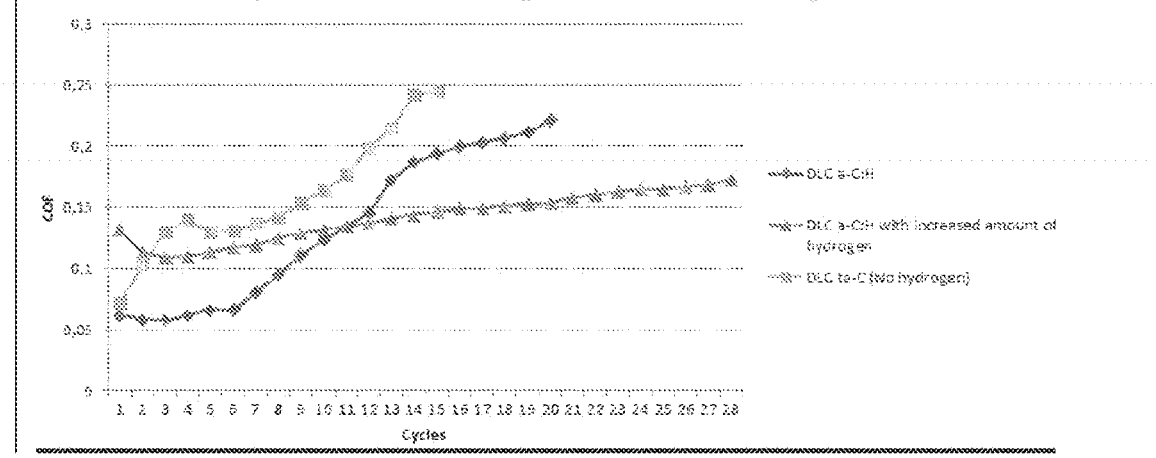
FIG. 5 illustrates COF as a function of the number of cycles for different DLC-coatings, at elevated temperature and nitrogen as pressure medium.

Reference is made to FIG. 5, illustrating the results of three full scale gate valve tests with no lubrication, elevated temperature to 135° C. and nitrogen gas at 69 MPa as the valve pressure medium resulting in a contact pressure between the sliding surfaces of 210 MPa. In these tests the different DLC coated seats has been sliding against a tungsten carbide coated gate. In this environment the hydrogenated DLC coating performs surprisingly better than the non-hydrogenated DLC. After 15 cycles the non-hydrogenated DLC test was aborted due to high friction. The DLC test with 17 atom-% hydrogen was stopped after 28 cycles, still having a COF 40% lower than the non-hydrogenated DLC.

The valve of the invention may comprise any feature as here described or illustrated, in any operative combination, and any such operative combination is an embodiment of the invention. The method of the invention may comprise any feature or step as here described or illustrated, in any operative combination, and any such operative combination is an embodiment of the invention. The use of the invention may comprise any feature or step as here described or illustrated, in any operative combination, and any such operative combination is an embodiment of the invention.

The invention claimed is:

1. A gate valve for control of petroleum liquid, gas, and water in any mixture ratio, the gate valve comprising:
   a top layer coating of diamond like carbon (DLC) on at least one surface of at least one of a gate and a seat subject to sliding in operation of the gate valve during subsea petroleum production, with said DLC coating on a nitride layer to mitigate sticking of the gate valve;
   wherein said DLC-coating comprises a combination of sp2 and sp3 bonds;
   wherein the gate valve is a subsea petroleum production or subsea water injection Xmas tree gate valve; and
   wherein the DLC-coating comprises more than 16 atom-% hydrogen.

2. The gate valve according to claim 1, wherein said coating is applied on top of a chrome nitride coating.

3. A method of commissioning or operating a gate valve according to claim 1, wherein during commissioning or assembly, the at least one surface with a DLC top layer coating subject to sliding in operation of the gate valve is operated or treated to a point beyond a top of high initial friction.

4. The method according to claim 3, wherein the commissioning of the gate valve comprises undertaking open-close cycles.

5. The method according to claim 3, wherein the commissioning of the gate valve comprises polishing of valve parts before assembly.

6. The gate valve of claim 1, wherein the DLC-coating comprises more than 17 atom-% hydrogen.

7. A method of eliminating sticking in a gate valve for control of petroleum liquid, gas, and water in any mixture ratio, the method comprising:
   coating at least one of a gate and a seat surface subject to sliding in operation of the gate valve during subsea petroleum production with a top layer coating of diamond like carbon (DLC);
   mitigating sticking of the gate valve with the DLC coating during subsea petroleum production;
   wherein the DLC coating comprises at least one of sp-3 bonds and a combination of sp-2 and sp-3 bonds;
   wherein the gate valve is a subsea petroleum production or subsea water injection Xmas tree gate valve;
   wherein the DLC coating comprises more than 16 atom-% hydrogen; and
   wherein the DLC coating is on a carbide layer.

8. The method of claim 7, wherein the DLC coating is coated on top of a chrome nitride coating.

9. A gate valve for control of petroleum liquid, gas, and water in any mixture ratio, the gate valve comprising:
   a top layer coating of diamond like carbon (DLC) on at least one surface of at least one of a gate and a seat subject to sliding in operation of the gate valve during subsea petroleum production, with said DLC coating on a carbide layer to mitigate sticking of the gate valve; and
   wherein said DLC-coating comprises more than 16 atom-% hydrogen.

\* \* \* \* \*